United States Patent
Zhai et al.

(10) Patent No.: US 10,672,430 B2
(45) Date of Patent: Jun. 2, 2020

(54) CHASSIS AND HEAT SINK FOR USE IN CHASSIS

(71) Applicant: EMC IP Holding Company LLC, Hopkinton, MA (US)

(72) Inventors: Haifang Zhai, Shanghai (CN); Yujie Zhou, Shanghai (CN); Qingqiang Guo, Shanghai (CN); Hendry Xiaoping Wu, Shanghai (CN); David Dong, Shanghai (CN); Michael Hao Zhou, Shanghai (CN)

(73) Assignee: EMC IP Holding Company LLC, Hopkinton, MA (US)

(*) Notice: Subject to any disclaimer, the term of this patent is extended or adjusted under 35 U.S.C. 154(b) by 0 days.

(21) Appl. No.: 15/954,748

(22) Filed: Apr. 17, 2018

(65) Prior Publication Data
US 2018/0299932 A1 Oct. 18, 2018

(30) Foreign Application Priority Data
Apr. 17, 2017 (CN) .......................... 2017 1 0250598

(51) Int. Cl.
| | | |
|---|---|---|
| G11B 33/14 | (2006.01) | |
| H05K 7/20 | (2006.01) | |
| G06F 1/20 | (2006.01) | |
| G11B 33/12 | (2006.01) | |
| G11B 33/02 | (2006.01) | |
| G11B 25/04 | (2006.01) | |

(52) U.S. Cl.
CPC .............. *G11B 33/142* (2013.01); *G06F 1/20* (2013.01); *G11B 33/02* (2013.01); *G11B 33/125* (2013.01); *G11B 33/128* (2013.01); *G11B 33/1406* (2013.01); *H05K 7/20736* (2013.01); *G11B 25/04* (2013.01)

(58) Field of Classification Search
CPC . G11B 33/142; H05K 7/20572–20581; H05K 7/20736
See application file for complete search history.

(56) References Cited

U.S. PATENT DOCUMENTS

| | | | | |
|---|---|---|---|---|
| 4,730,233 | A * | 3/1988 | Osterman | H05K 7/20572 361/693 |
| 6,987,673 | B1 | 1/2006 | French et al. | |
| 7,027,439 | B1 | 4/2006 | Barrow et al. | |
| 7,046,513 | B2 * | 5/2006 | Nishiyama | H05K 7/20572 165/122 |
| 7,061,715 | B2 * | 6/2006 | Miyamoto | G06F 1/20 360/99.25 |
| 7,159,758 | B1 | 1/2007 | Downes et al. | |

(Continued)

*Primary Examiner* — Robert J Hoffberg
(74) *Attorney, Agent, or Firm* — BainwoodHuang

(57) ABSTRACT

The present disclosure relates to a chassis and a heat sink for use in the chassis. Disks in rows are arranged in the chassis, and the heat sink comprises an air ingress channel extending from a first end of a housing of the chassis to a side portion of the disks away from the first end; an air egress channel extending from the first end to a second end opposite to the first end, the air egress channel being spaced apart from the air ingress channel by the disks; an intermediate channel comprised of gaps between the disks and fluidically communicating the air ingress channel with the air egress channel; and a fan disposed in the air egress channel and being operable to form a negative pressure in the air egress channel.

14 Claims, 5 Drawing Sheets

(56) References Cited

U.S. PATENT DOCUMENTS

| | | | |
|---|---|---|---|
| 7,167,359 B2* | 1/2007 | Wendel | G11B 33/08 |
| | | | 211/41.17 |
| 7,215,552 B2* | 5/2007 | Shipley | H05K 7/20563 |
| | | | 165/104.33 |
| 7,252,100 B1 | 8/2007 | Downes et al. | |
| 7,280,353 B2* | 10/2007 | Wendel | G11B 33/08 |
| | | | 361/679.33 |
| 7,319,586 B2* | 1/2008 | Hall | G11B 33/08 |
| | | | 211/41.17 |
| 7,349,205 B2* | 3/2008 | Hall | G11B 33/08 |
| | | | 349/58 |
| 7,359,188 B2* | 4/2008 | Hall | G11B 33/08 |
| | | | 361/679.33 |
| 7,391,609 B2* | 6/2008 | Hall | G11B 33/08 |
| | | | 361/679.33 |
| 7,447,015 B2* | 11/2008 | Hall | G11B 33/08 |
| | | | 323/282 |
| 7,486,526 B1 | 2/2009 | Frangioso, Jr. et al. | |
| 7,505,264 B2* | 3/2009 | Hall | G11B 33/08 |
| | | | 360/264.7 |
| 7,508,663 B2* | 3/2009 | Coglitore | H05K 7/20736 |
| | | | 165/122 |
| 7,542,288 B2* | 6/2009 | Lanus | H05K 7/20563 |
| | | | 361/695 |
| 7,626,805 B2* | 12/2009 | Hall | G11B 33/142 |
| | | | 312/223.4 |
| 7,630,196 B2* | 12/2009 | Hall | G11B 33/142 |
| | | | 206/707 |
| 7,646,597 B2* | 1/2010 | Hall | G11B 33/08 |
| | | | 360/97.15 |
| 7,652,891 B2* | 1/2010 | Lucero | G06F 1/20 |
| | | | 361/752 |
| 7,701,700 B2* | 4/2010 | Hall | G11B 33/142 |
| | | | 211/26 |
| 7,722,359 B1 | 5/2010 | Frangioso, Jr. et al. | |
| 7,830,770 B1 | 11/2010 | Linnell | |
| 7,864,541 B2* | 1/2011 | Lucero | G06F 1/20 |
| | | | 361/679.51 |
| 8,116,075 B2* | 2/2012 | Hall | G11B 33/142 |
| | | | 211/26 |
| 8,315,052 B2* | 11/2012 | Chan | H05K 7/20736 |
| | | | 165/121 |
| 8,659,895 B1* | 2/2014 | Carlson | H05K 7/20745 |
| | | | 361/694 |
| 8,743,549 B2* | 6/2014 | Frink | G06F 1/187 |
| | | | 361/724 |
| 8,929,024 B1* | 1/2015 | Sorenson, III | G11B 25/043 |
| | | | 360/97.13 |
| 9,141,156 B2* | 9/2015 | Ross | G06F 1/20 |
| 9,148,349 B1 | 9/2015 | Burr et al. | |
| 9,298,230 B2* | 3/2016 | Wei | H05K 7/20736 |
| 9,363,926 B1* | 6/2016 | Beall | H05K 7/20736 |
| 9,411,525 B2* | 8/2016 | Frink | G06F 1/187 |
| 9,474,190 B1* | 10/2016 | Beall | G06F 1/185 |
| 9,482,464 B1 | 11/2016 | Burke | |
| 9,734,674 B2 | 8/2017 | Rabe et al. | |
| 9,785,600 B2* | 10/2017 | Frink | G06F 1/187 |
| 9,934,824 B2* | 4/2018 | Sorenson, III | G11B 25/043 |
| 9,936,611 B1* | 4/2018 | Beall | H05K 7/20736 |
| 10,130,018 B2* | 11/2018 | Ross | G06F 1/20 |
| 10,139,874 B2* | 11/2018 | Zhai | H05K 5/0213 |
| 10,198,390 B2* | 2/2019 | Frink | G06F 1/187 |
| 10,222,842 B2* | 3/2019 | Ross | G06F 1/20 |
| 10,356,954 B2* | 7/2019 | Bao | A47B 53/00 |
| 10,426,060 B2* | 9/2019 | Beall | B21D 39/00 |
| 10,539,985 B2* | 1/2020 | Beall | G06F 1/185 |
| 2010/0091458 A1* | 4/2010 | Mosier, Jr. | H05K 7/20572 |
| | | | 361/695 |
| 2012/0134103 A1* | 5/2012 | Tan | H05K 7/20736 |
| | | | 361/679.46 |
| 2017/0084516 A1* | 3/2017 | Harada | H01L 23/467 |

\* cited by examiner

CHASSIS AND HEAT SINK FOR USE IN CHASSIS

RELATED APPLICATIONS

This application claim priority from Chinese Patent Application Number CN201710250598.3, filed on Apr. 17, 2017 at the State Intellectual Property Office, China, titled "CHASSIS AND HEAT SINK FOR USE IN CHASSIS" the contents of which is herein incorporated by reference in its entirety.

FIELD

Embodiments of the present disclosure generally relate to a storage device, and more specifically, to a chassis and a heat sink for use in the chassis.

BACKGROUND

During design and use of a Disk Array Enclosure (DAE), since disks (comprising but not limited to magnetic disk, CD, hard disk, U disk) generate a lot of heat during operation, a challenge to be taken is how to enable the disks to be cooled better. Particularly, a temperature of disks farthest from a fan or an air intake becomes very high. Hence, these disks are more vulnerable to the risk of high temperature. If no measure is taken for these disks, damages are inevitably caused to these disks.

SUMMARY

Embodiments of the present disclosure provide a solution for providing a chassis and a heat sink for use in the chassis.

In a first aspect, a heat sink for use in a chassis is provided. Disks are arranged in rows in the chassis, and the heat sink comprises an air ingress channel extending from a first end of a housing of the chassis to a side portion of the disks away from the first end; an air egress channel extending from the first end to a second end opposite to the first end, the air egress channel being spaced apart from the air ingress channel by the disks; an intermediate channel comprising gaps between the disks and in fluid communication with the air ingress channel and the air egress channel; and a fan disposed within the air egress channel and being operable to form a negative pressure in the air egress channel.

In some embodiments, in the above heat sink, the air ingress channel comprises an air inlet located at the first end; and the air egress channel further comprises an air outlet located at the second end; the fan is disposed adjacent to the air outlet.

In some embodiments, the above heat sink further comprises at least one column of partitions disposed within the housing, the disks in rows being arranged as abutting against the partitions.

In some embodiments, in the above heat sink, the air ingress channel comprises a plurality of air flow outlets arranged as being corresponding to the gaps between the disks; and the air egress channel comprises a plurality of air flow inlets arranged as being corresponding to the gaps between the disks.

In some embodiments, in the above heat sink, an area of the air flow outlet and an area of the air flow inlet gradually reduce from the first end towards the second end.

In some embodiment, in the above heat sink, the area of a section of the air ingress channel parallel to the first end gradually reduces from the first end towards the side portion of the disks; and an area of a section of the air egress channel parallel to the first end gradually increases from the side portion of the disks towards the second end.

In some embodiments, in the above heat sink, the partitions are arranged parallel to the first end.

In some embodiments, in the above heat sink, the air inlet is arranged adjacent to a top cover of the housing, and the air outlet is arranged adjacent to a bottom of the housing.

In some embodiments, in the above heat sink, the air ingress channel is arranged between the top cover and the disks, and the air egress channel is located between the bottom of the housing and the disks.

In some embodiments, in the above heat sink, the partitions are disposed perpendicular to the first end, and comprise through holes disposed on the partitions as being corresponding to the gaps of the disks.

In some embodiments, in the above heat sink, the air inlet is arranged adjacent to a first sidewall of the housing, and the air outlet is arranged adjacent to a second sidewall of the housing, and the first sidewall is opposite to the second sidewall.

In some embodiments, in the above heat sink, the air ingress channel is arranged between the first sidewall and the disks, and the air egress channel is arranged between the second sidewall and the disks.

In some embodiments, in the above heat sink, the partitions are disposed oblique to the first end, and comprise through holes disposed on the partitions as being corresponding to the gaps of the disks.

In some embodiments, in the above heat sink, the partitions comprise at least two partitions, and the at least two partitions are arranged symmetrically with respect to a plane that is parallel to a first sidewall of the housing and passes through a center of the first end.

In some embodiments, in the above heat sink, the air inlet is arranged in a middle of the first end, and extends from a top cover of the housing to a bottom of the housing, and the air outlet is arranged adjacent to the bottom or top cover.

In some embodiments, in the above heat sink, the air ingress channel is arranged between disks that are symmetrical with and adjacent to one another, and the air egress channel is arranged between the first sidewall of the housing and the disks and between a second sidewall and the disks.

In second aspect, a chassis is provided. The chassis comprises a housing for receiving disks arranged in rows; and the above-mentioned heat sink.

In third aspect, a method of manufacturing the above-mentioned heat sink is provided.

Further features of the present disclosure will be made apparent through the following description of exemplary embodiments with reference to figures.

It is to be understood that Summary of the Invention is not intended to identify key or important features of embodiments of the present disclosure, not is it intended to limit the scope of the present disclosure. Other features of the present disclosure will be made apparent through the following depictions.

BRIEF DESCRIPTION OF THE DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

DETAILED DESCRIPTION

Figure 1:
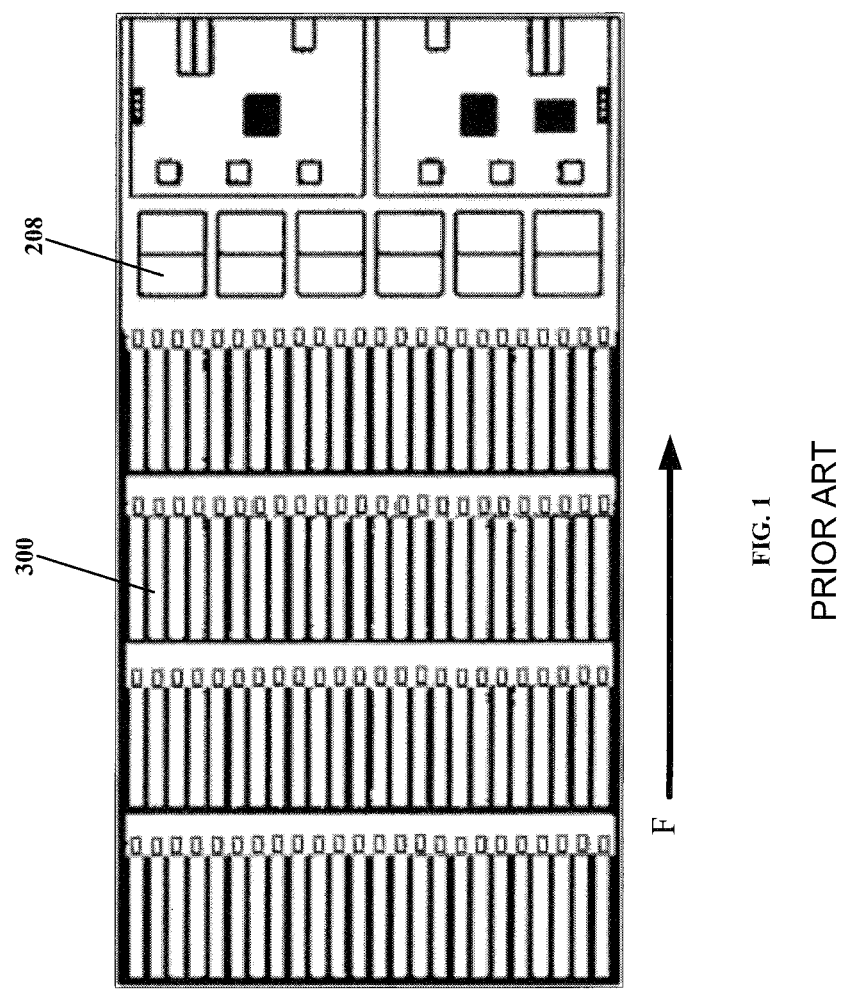
FIG. 1 illustrates an overall cross-sectional view of a chassis according to the prior art.

Principles of the present disclosure will now be described with reference to various example embodiments illustrated in the drawings. It is to be understood that the depiction of these embodiments is only to enable those skilled in the art to better understand and further implement the present invention, not intended for limiting the scope of the present invention in any manner. It is noted that wherever practicable similar or like reference numbers may be used in the figures, and may indicates similar or like functionality. One skilled in the art will readily recognize from the following description that alternative embodiments of the structures and methods illustrated herein may be employed without departing from the principles of the present disclosure described therein.

As used herein, the term "comprises" and its variants are to be read as open terms that mean "comprises, but is not limited to." The term "based on" is to be read as "based at least in part on." The term "one implementation" and "an implementation" are to be read as "at least one implementation." The term "another implementation" is to be read as "at least one other implementation."

During design a Disk Array Enclosure, since disks generate a lot of heat during operation, its heat sink system is subjected to a huge challenge. A conventional solution is shown in FIG. 1. The Inventor finds that since an air flow F passes through multiple rows of disks 300, after cold air enters through an air inlet, it is pre-heated by the disks adjacent to the air inlet and the temperature is raised. However, the pre-heated air flow exhibits a poorer heat dissipation effect, and when the pre-heated air flow passes by disks farther or farthest away from the air inlet, the heat dissipation effect for these disks will fall. Particularly, the number of rows of disks in the current chassis increases constantly, and the power also increases constantly. If the heat dissipation problem of disks farther away from the air inlet is not solved, these disks may be inevitably damaged in advance.

Embodiments of the present disclosure provide a heat sink for use in a chassis to at least partially solve the above and other potential problems of the conventional solution.

Figure 2:
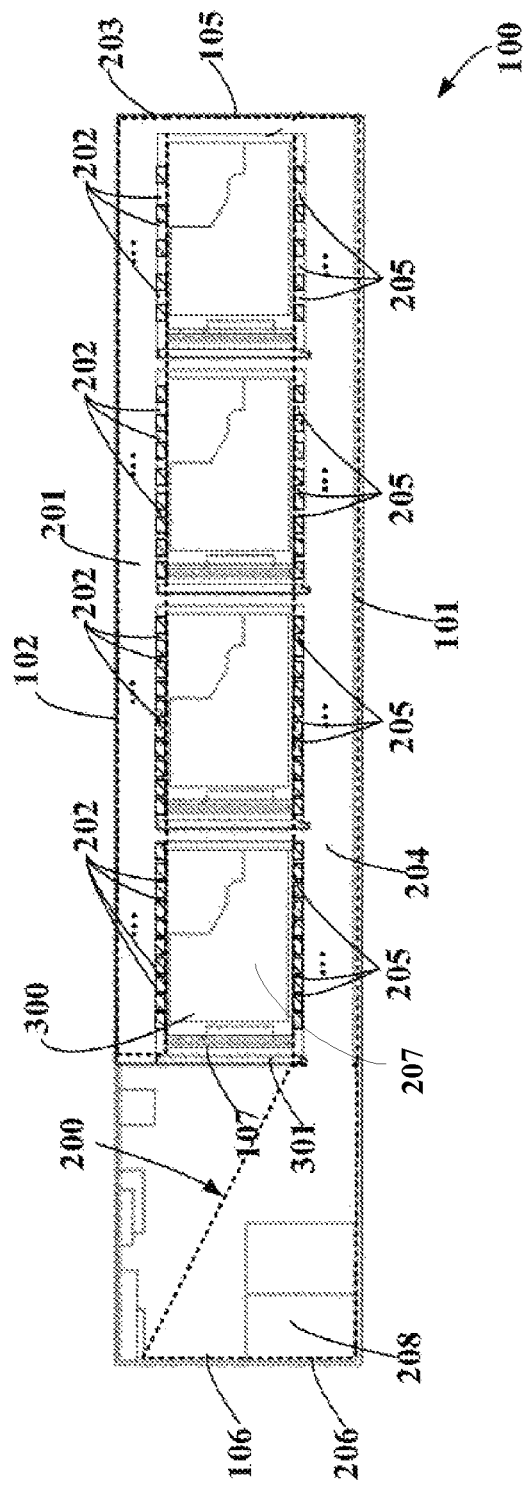
FIG. 2 illustrates an overall cross-sectional view of a chassis according to an exemplary embodiment of the present disclosure.
Figure 3:
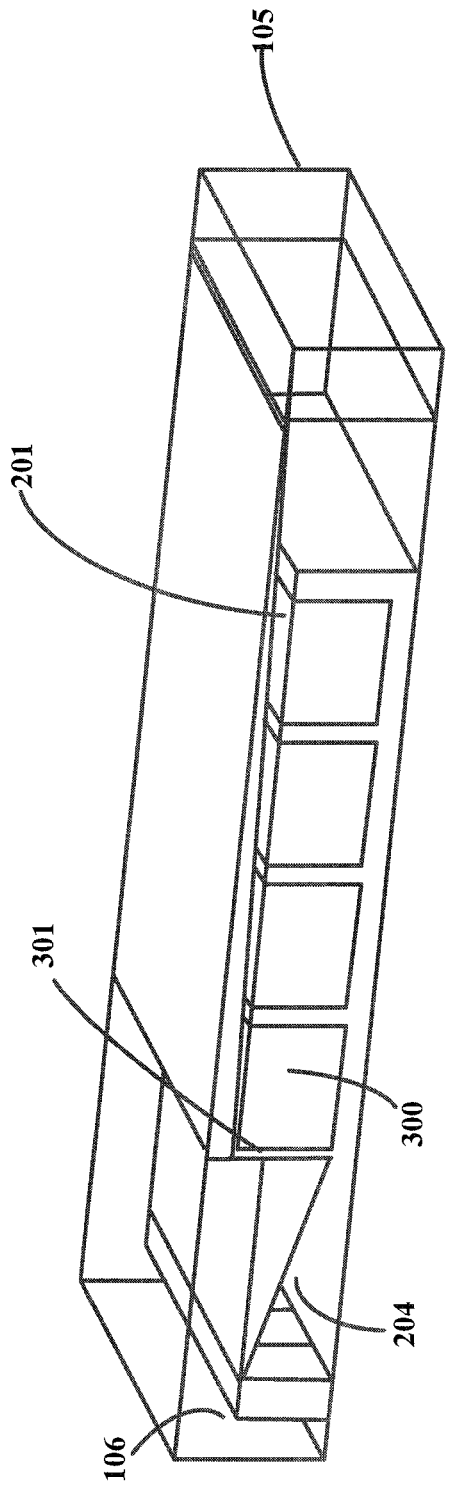
FIG. 3 illustrates a perspective view of a chassis according to an exemplary embodiment of the present disclosure.
Figure 4:
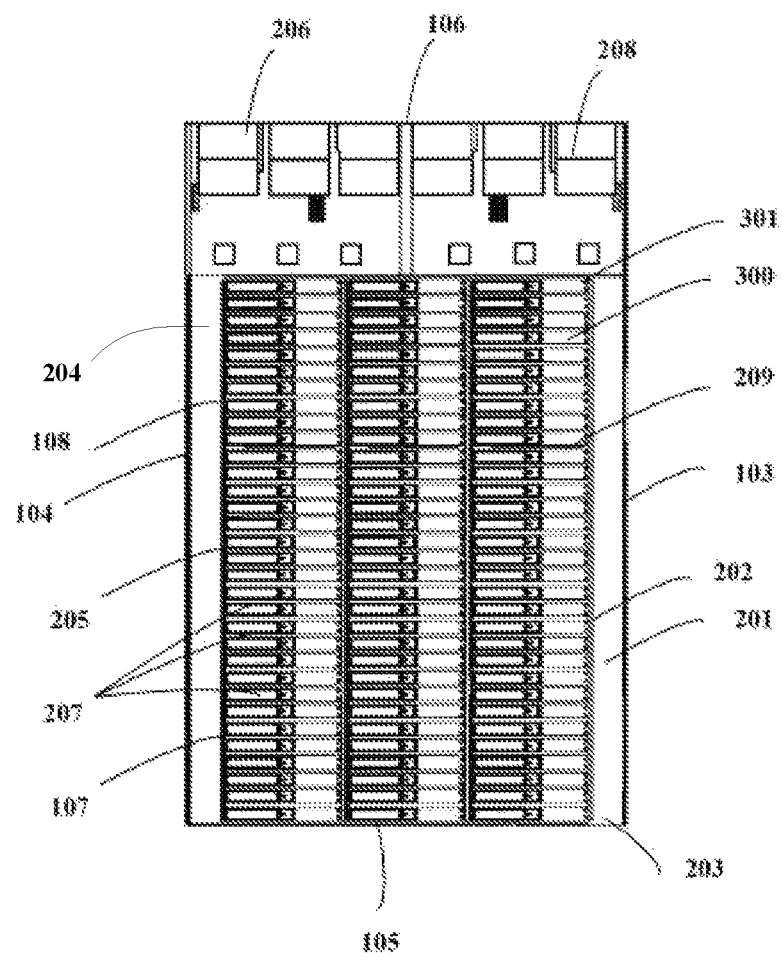
FIG. 4 illustrates an overall cross-sectional view of a chassis according to another exemplary embodiment of the present disclosure.
Figure 5:
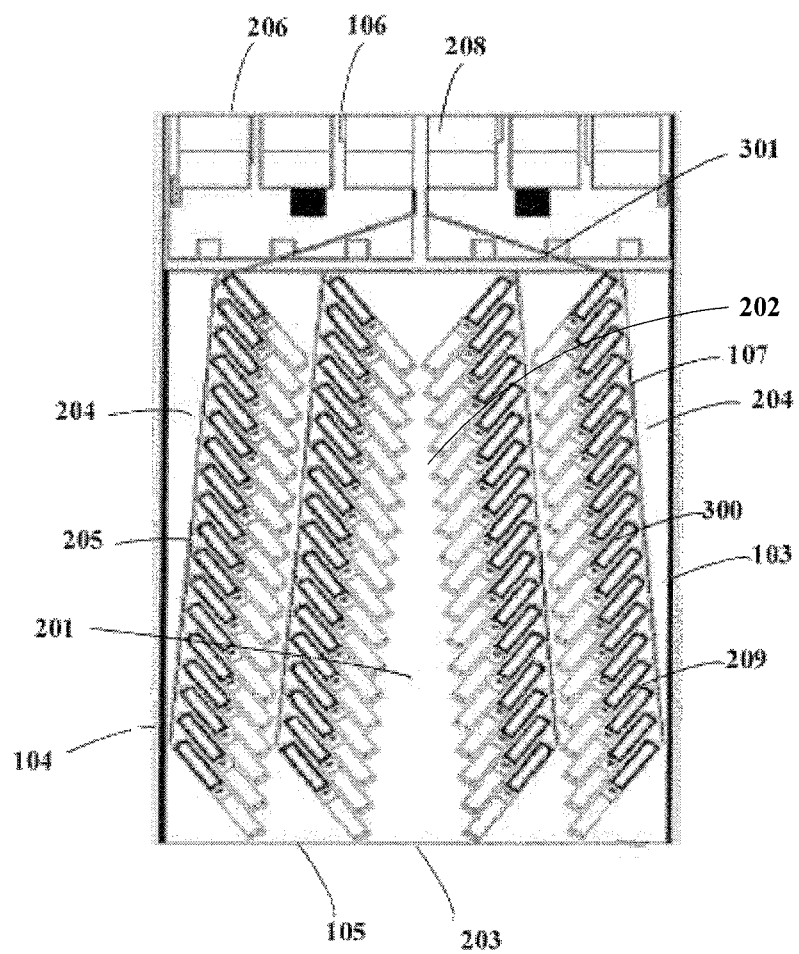
FIG. 5 illustrates an overall cross-sectional view of a chassis according to another exemplary embodiment of the present disclosure.

Hereinafter, references are made to FIGS. 2-5 to illustrate the structure of a heat sink according to exemplary embodiments of the present disclosure. FIG. 2 illustrates an overall cross-sectional view of a heat sink of a chassis according to an exemplary embodiment of the present disclosure; FIG. 3 illustrates a perspective view of a heat sink of a chassis according to an exemplary embodiment of the present disclosure; FIG. 4 illustrates an overall cross-sectional view of a heat sink of a chassis according to another exemplary embodiment of the present disclosure; and FIG. 5 illustrates an overall cross-sectional view of a heat sink of a chassis according to another exemplary embodiment of the present disclosure.

As shown in FIG. 2, generally the chassis described herein comprises a housing 100. The housing 100 comprises a bottom 101, a top cover 102, two sidewalls (a first sidewall 103 and a second sidewall 104) and two opposite ends, respectively referred to as "a first end" 105 and "a second end" 106. The housing 100 appears substantially square. The housing 100 substantially has a height of 2 U or 3 U. The height here refers to a height of sidewalls 103, 104 or ends 105, 106, namely, a distance from the bottom 101 to the top cover 102. U is a measure unit representing external dimensions of a server. Detailed dimensions follow the requirements of Electronic Industries Association of the United States as an association in the industry.

The housing 100 accommodates at least multiple rows of disks 300. It is to be understood that these disks 300 generally function to store data, and comprise but not limited to magnetic disks, CDs, hard disks and U disks. The heat sink 200 is in the housing 100 and used to enable the disk 300 and elements in the housing 100 such as a corresponding circuit board to be cooled to keep an excellent operation state. The heat sink 200 comprises an air ingress channel 201, an air egress channel 204, an intermediate channel 207 and a fan 208. The fan 208 is disposed in the air egress channel 204 and used to form a negative pressure in the air egress channel 204. The intermediate channel 207 of the heat sink comprises gaps 209 between multiple rows of disks 300. The negative pressure formed by the fan 208 in the air egress channel 204 enables the cold air to enter the air ingress channel 201, undergo heat dissipation of the intermediate channel 207 and then enter the air egress channel 204.

Different from the heat sink of the conventional chassis, the air ingress channel 201 extends from the first end 105 to a side 301 of the disk 300 away from the first end 105. The air egress channel 204 extends from the first end 105 to the second end 106. That is, the air ingress channel 201 and air egress channel 204 are spaced apart by the disk 300, and across the disk 300 from the first end 105 to the side 301 away from the first end 105. Furthermore, the air ingress channel 201 and air egress channel 204 are in fluid communication via the intermediate channel 207. Such an arrangement makes the cold air entering the air ingress channel 201 through the negative pressure may be discharged simultaneously through multiple outlets 202 to the gaps 209 (namely, intermediate channel 207) between the multiple rows of disks 300, to simultaneously cool the multiple rows of disks 300. The temperature difference between the cold air and the disk 300 enables the cold air to take away a lot of heat from the disk 300. Advantageously, this makes the cooling effect optimal. After the heat is taken away from the disk 300, the temperature of the cold air rises correspondingly. The air with raised temperature exhibits a substantially falling cooling effect. Due to the action of the negative pressure of the air egress channel 204, the air with raised temperature simultaneously enters the air egress channel 204 through multiple inlets 205 and is finally blown out of the housing 100 by the fan 208.

In some embodiments, as shown in FIG. 2, the first end 105 of the housing 100 of the air ingress channel 201 has an air inlet 203 through which the cold air enters the air ingress channel from the housing 100. It is to be understood that the position of the air inlet 203 may be adjusted according to needs. For example, in some embodiments, the air inlet 203 may be located at the top cover of the housing 100 or the first sidewall 103 and/or second sidewall 104. The position of the air inlet 203 at the first end may be adjusted as needed, which will be further discussed in detail below. As shown in FIG. 2, the air egress channel 204 has an air outlet 206 at the second end 106 through which the heated air is blown out of the housing 100 by the fan 208. In some embodiments as shown in FIGS. 2-5, the fan 208 is arranged at a location adjacent to the air outlet 203, and used to blow from the interior to the exterior of the air egress channel 204 to thereby form the negative pressure in the air egress channel 204. The fan 208 may comprise a plurality of fans which are arranged along the air outlet 203 of the air egress channel 204, thereby increasing the effect of the negative pressure formed in the air egress channel 204. In order to increase the effect of the negative pressure formed by the fan 208 in the air egress channel 204, the fan 208 and the sidewall of the air outlet 203 may be sealed using some sealing means. The common sealing means in the field all may be applied to the sealing here, for example, adhesion by using an adhesive, an elastic sealing ring or the like.

In some embodiments, as shown in FIGS. 2-5, at least one column of partitions 107 are in the interior of the housing 100, and the partitions 107 are used for being abutted by multiple rows of disks 300 received in the housing 100. In some embodiments, the number of columns of the partitions 107 is 3-4. The multiple rows of disks 300 abut against the partitions 107 with a gap 209 between the disks 300. However, it is to be understood that the number of partitions 107 is not limited and may be determined according to the size of the chassis and corresponding size of the disks 300. It is to be understood that in the case of more than one column of partitions 107, the intermediate channel 207 described above may also comprise gaps between the partitions 107 and multiple rows of disks 300 not abutting against the partitions 107.

In some embodiments, as shown in FIGS. 2-5, the air ingress channel 201 comprises a plurality of air flow outlets 202 which are located on a side of the air ingress channel 201 adjacent to the disks 300 and arranged as being corresponding to the gaps 209 between the disks 300. The air egress channel 204 comprises a plurality of air flow inlets 205 which are located on a side of the air egress channel 204 adjacent to the disks 300 and arranged as being corresponding to the gaps 209. In this way, it is possible to ensure the fluid communication between the air ingress channel 201 and the air egress channel 204, and ensure the air flow to flow through the gaps 209 between disks 300 and thereby effectively cool the disks 300. In some embodiments, the air flow outlets 202 and air flow inlets 205 may be a plurality of rows of holes arranged parallel to the first end 105 of the housing 100. The holes may employ square holes, circular holes, oval holes, triangular holes or other polygonal holes. In some embodiments, the air flow outlet 202 and air flow inlet 205 may be elongate slits extending from the first end 105 to the second end 106. It is to be understood that the air flow outlet 202 and air flow inlet 205 may also take other forms so long as the fluid communication between the air ingress channel 201 and air egress channel 204 via the intermediate channel 207 can be ensured.

In some embodiments, as shown in FIG. 2, an area of the air flow outlet 202 and an area of air flow inlet 205 gradually reduce as they extend from the first end 105 to the second end 106. This is because the space in the air egress channel 204 is a relatively narrow and long space, and the negative pressure formed by the fan 208 disposed adjacent to the air outlet 206 gradually weakens away from the fan 208. Therefore, in order to ensure the air ingress amount between disks 300 is distributed evenly, the area of the opening of the air flow outlet 202 and air flow inlet 205 is set larger at a location away from the fan 208 where there is a weaker negative pressure, namely, a location adjacent to the first end 105. The area of the opening of the air flow outlet 202 and air flow inlet 205 is set smaller at a location closer to the fan 208 where there is a stronger negative pressure, namely, a location adjacent to the second end 106. In this way, the air through the gap 209 between disks 300 is ensured to be uniform. In the embodiment shown in FIG. 2, four columns of partitions 107 extend from the first end 105 to the second end 106, and each of the partitions 107 is provided with multiple disks 300 arranged in rows. The area of the air flow outlet 202 and air flow inlet 205 corresponding to the gaps 209 between disks 300 on the multiple columns of partitions 107 from the first end 105 to the second end 106 may be 95%, 65%, 20% and 12% respectively. Certainly, it is to be understood that the sectional areas of the air flow outlet 202 and air flow inlet 205 from the first end 105 to the second end 106 may be changed stepwise, or may be reduced gradually. For example, in some embodiments described above, in case that the air flow outlet 202 and air flow inlet 205 are elongate slits extending from the first end 105 to the second end 106, it is feasible to employ a manner that the width of each slit is gradually reduced from the first end 105 to the second end 106. In case that the air flow outlet 202 and air flow inlet 205 are holes as mentioned above, it is feasible to employ a manner that the area of each hole is gradually reduced from the first end 105 to the second end 106.

In some embodiments, as shown in FIG. 3, the air ingress channel 201 is generally a wedge-shaped structure, i.e., the area of the section of the air ingress channel 201 parallel to the first end 105 is gradually reduced from the first end 105 towards the side 301 of the disks 300. In some embodiments, the area of the section is equal to the area of the air inlet 203 at the first end 105 and reduced to 0 at the side 301 of the disks 300. In addition, the cross-sectional area of the air egress channel parallel to the first end 105 from the first end 105 to the side 301 of the disks 300 substantially remains unchanged, whereas the cross-sectional area is gradually increased as the air egress channel extends from the side 301 of the disks 300 to the second end 106 until the cross-sectional area is finally equal to the cross-sectional area of the air outlet 206. Such an arrangement may further ensure uniformity of air flow passing through the gaps 209 between the disks 300.

In some embodiments, as shown in FIGS. 2 and 3, the partitions 107 are arranged parallel to the first end 105. Such an arrangement is generally used in a 3 U chassis. The disks 300 arranged in rows abut against the partitions 107. There exist a slit between the partitions 107 and the disks on the adjacent partitions. It is to be understood that in some embodiments, the air flow outlet 202 and air flow inlet 205 are disposed as being corresponding to the gaps 209 between disks 300, and besides, they may also be disposed as being corresponding to the slits, to make the temperature reduction effect for the disks 300 more effective.

In some embodiments, as shown in FIGS. 2 and 3, the air inlet 203 is disposed at a portion of the first end 105 adjacent to the top cover 102 of the housing 100. The air inlet 203 may have a grid structure to prevent entry of impurities affecting operation of the disks 300 and electronic devices in the chassis. In some embodiments, the air inlet 203 may take the form of holes or slits in other shapes. For example, the air inlet 203 may also be holes in various shapes disposed on the first end. In addition, the air outlet 206 is disposed at the second end 106 adjacent to the bottom 101 of the housing 100. One or more fans 208 are sealed in the air outlet 206. Without affecting the normal operation of the fan 208, in some embodiments, the air outlet 206 may be provided with a reinforcing structure, for example, a plurality of narrow strips which are integral with the second end 106 and cross the air outlet 206 may be provided.

In some embodiments, as shown in FIGS. 2 and 3, the air ingress channel 201 is disposed between the top cover 102 of the housing 100 and the disks 300. In addition, the air egress channel 204 is disposed between the bottom 101 of the housing 100 and the disks 300. In the embodiment as shown in FIGS. 2 3, the height of the air ingress channel 201 and air egress channel 204 is generally 0.5 U, wherein the height of the disk 300, namely, a distance from the side of the air ingress channel 201 adjacent to the disk 300 to the side of the air egress channel 204 adjacent to the disk 300, is generally 2 U. Hence, the height of the whole chassis, namely, the distance from the top cover 102 to the bottom 101, is generally 3 U. Other dimensions of the 3 U chassis are also standard dimensions so that the chassis is adapted in storage devices to which the 3 U chassis can be plugged.

FIG. 4 illustrates an overall cross-sectional view of another example implementation of the heat sink 200 according to the present disclosure. Hereinafter, the difference between the implementation of the example and the heat sink 200 as shown in FIGS. 2-3 will be mainly discussed, and the same portions therebetween will not be repeated below.

In some embodiments, as shown in FIG. 4, the partition 107 is disposed as being perpendicular to the first end 105. Such an arrangement is generally applied to a 2 U chassis. In the housing 100 of such chassis, a distance from the top cover 102 to the bottom 101 is generally 2 U, namely, the height of disks 300. Therefore, in this form of housing 100, the top cover 102 and bottom 101 are disposed adjacent to the disks 300. The 2 U chassis is adapted in storage devices to which the 2 U chassis may be plugged. In the embodiment as shown in FIG. 4, a plurality of through holes 108 may be provided on the partition 107 corresponding to gaps 209 of the disks 300. There are no limitations to the forms of the through holes 108. The through holes may be a plurality of apertures arranged along the gaps 209 of the disks 300, or slits extending along the gaps 209.

In some embodiments, as shown in FIG. 4, the air inlet 203 is arranged at a location of the first end 105 adjacent to the first sidewall 103. The air outlet 206 is disposed at a location of the second end 106 adjacent to the second sidewall 104 opposite to the first sidewall 103. In some embodiments, the air inlet 203 and air outlet 206 extend from the top cover 102 to the bottom 101, namely, the air inlet 203 and air outlet 206 may have a 2 U height. Certainly, the air inlet 203 and air outlet 206 may only have a 1 U or 1.5 U height, namely, partially extend from the above location. Other features of the air inlet 203 and air outlet 206 may be the same as the air inlet 203 disposed adjacent to the top cover 102 and the air outlet disposed adjacent to the bottom 101 described above.

In some embodiments, as shown in FIG. 4, the air ingress channel 201 is arranged between the first sidewall 103 and disk 300, and the air egress channel 204 is arranged between the second sidewall 104 and disk 300. In this case, there is a transverse air flow in the intermediate channel 207 which is fluid communication with the air ingress channel 201 and the air egress channel 204. In these embodiments, the intermediate channel 207 further comprises a plurality of through holes 108 disposed on the partitions. In this way, the cold air simultaneously entering the gaps 209 of the disks 300 from the air ingress channel 201 passes through the gaps 209 and the through holes 108, thereby taking away the heat from the disks 300 and partitions 107. In other words, such an arrangement further facilitates heat dissipation of the partitions 107. In some embodiments, the 2 U chassis is generally provided with three columns of partitions 107. The remaining portion of the width of the housing (namely, the distance from the first sidewall 103 to the second sidewall 104) is averagely used for the air ingress channel 201 and air egress channel 204.

FIG. 5 illustrates an overall cross-sectional view of another example implementation of the heat sink 200 according to the present disclosure. Hereinafter, the difference between the implementation of the example and the heat sink 200 as shown in FIGS. 2-4 will be mainly discussed, and the same portions therebetween will not be repeated below.

In some embodiments, as shown in FIG. 5, the partitions 107 are disposed as being oblique to the first end 105. In the embodiment, the partitions may also be provided with through holes 108 corresponding to the gaps 209 of the disks 300 to enhance air circulation of the intermediate channel 207. The partitions 107 arranged in this form may be applied to the 2 U chassis.

In some embodiment, as shown in FIG. 5, the number of partitions 107 is at least two, for example two or four. The two or four partitions are arranged symmetrically with respect to a plane that is parallel to the first sidewall 103 or second sidewall 104 of the housing 100 and passes through the center of the first end 105. The multiple disks 300 in rows abut against the partitions 107 substantially perpendicularly or slightly obliquely.

In some embodiments, as shown in FIG. 5, the air inlet 203 is arranged in the middle of the first end 105, namely, a middle portion of the first end 105 between the first sidewall 103 and second sidewall 104. In some embodiments, the air inlet 203 extends from the top cover 102 to the bottom 101 of the housing 100. In some embodiments, the air outlet may be disposed adjacent to the top cover 102 or adjacent to the bottom 101.

In some embodiments, as shown in FIG. 5, the air ingress channel 201 is arranged between disks 300 which are symmetrical with and adjacent to one another, namely, the air ingress channel 201 extends substantially along the plane that passes through the middle of the first end 105. The air egress channel 204 is arranged between the first sidewall 103 and disks 300, and between the second sidewall 104 and disks 300. In this case, the flow direction of the air flow is substantially in a tree-shaped structure.

Although some specific embodiments of the present disclosure have already been displayed in detail by way of examples, those skilled in the art should appreciate that the above examples are only intended to exemplarily but non-restrictively limit the scope of the present disclosure. Those skilled in the art appreciate that the above embodiments may be modified without departing from the scope and essence of the present disclosure. The scope of the present disclosure is limited by the appended claims.

In the description and claims hereunder, unless otherwise additionally needed in the context, the terms "comprise" and "comprise" are understood as comprising the illustrated components or component groups, without excluding any other components or component groups.

Citations of any prior art in the description are not, and should not be considered as admitting to imply that these prior art constitute the common knowledge.

It is to be understood that the claims below are only temporary claims, are examples of possible claims, and are not intended to limit the scope of the claims to any future patent application based on the present application. It is possible to add components to or delete components from the exemplary claims in the future to further limit or re-limit the present disclosure.

We claim:

1. A heat sink for use in a chassis, disks being arranged in rows in the chassis, the heat sink comprising:
an air ingress channel extending from a first end of a housing of the chassis to a side portion of the disks away from the first end;
an air egress channel extending from the first end to a second end that is opposite to the first end, the air egress channel being spaced apart from the air ingress channel by the disks;
an intermediate channel comprising gaps between the disks and in fluid communication with the air ingress channel and the air egress channel; a fan disposed within the air egress channel and being operable to form a negative pressure in the air egress channel; and
vertical partitions disposed within the housing, the disks being arranged in the rows in the chassis, the disks being further arranged as abutting against the vertical partitions;
wherein the air ingress channel comprises a plurality of air flow outlets arranged as being corresponding to the gaps between the disks;
wherein the air egress channel comprises a plurality of air flow inlets arranged as being corresponding to the gaps between the disks; and
wherein areas of each of the air flow outlets and each of the air flow inlets gradually reduce from the first end towards the second end.

2. The heat sink of claim 1, wherein the air ingress channel comprises an air inlet located at the first end;
wherein the air egress channel further comprises an air outlet located at the second end; and
wherein the fan is disposed adjacent to the air outlet.

3. The heat sink of claim 1, wherein the side portion of the disks away from the first end provides a furthest one of the rows of the disks within the chassis;
wherein an area of a section of the air ingress channel parallel to the first end gradually reduces from the first end towards the side portion of the disks; and
wherein an area of a section of the air egress channel parallel to the first end gradually increases from the side portion of the disks towards the second end.

4. The heat sink of claim 1, wherein the vertical partitions are arranged parallel to the first end.

5. The heat sink of claim 4, wherein an air inlet is arranged adjacent to a top cover of the housing, and an air outlet is arranged adjacent to a bottom of the housing.

6. The heat sink of claim 5, wherein the air ingress channel is arranged between the top cover and the disks, and the air egress channel is located between the bottom of the housing and the disks.

7. The heat sink of claim 1, wherein the vertical partitions are disposed perpendicular to the first end and comprise through holes disposed in the vertical partitions as being corresponding to the gaps of the disks.

8. The heat sink of claim 7, wherein an air inlet is arranged adjacent to a first sidewall of the housing, and an air outlet is arranged adjacent to a second sidewall of the housing, the first sidewall being opposite to the second sidewall.

9. The heat sink of claim 8, wherein the air ingress channel is arranged between the first sidewall and the disks, and the air egress channel is arranged between the second sidewall and the disks.

10. The heat sink of claim 1, wherein the vertical partitions are disposed oblique to the first end and comprise through holes disposed on the vertical partitions as being corresponding to the gaps of the disks.

11. The heat sink of claim 10, wherein the vertical partitions comprise at least two vertical partitions, and the at least two vertical partitions are arranged symmetrically with respect to a plane that is parallel to a first sidewall of the housing and the plane passes through a center of the first end.

12. The heat sink of claim 11, wherein the air inlet is arranged in a middle of the first end, and the air outlet is arranged adjacent to a bottom of the housing or a top cover of the housing.

13. The heat sink of claim 11, wherein the air egress channel comprises two air egress channels, the air ingress channel is arranged between the disks that are symmetrical with and adjacent to one another, and the two air egress channels are arranged between the first sidewall of the housing and the disks and between a second sidewall and the disks, respectively.

14. A chassis, comprising:
a housing for receiving disks arranged in rows; and
a heat sink comprising:
an air ingress channel extending from a first end of the housing of the chassis to a side portion of the disks away from the first end;
an air egress channel extending from the first end to a second end that is opposite to the first end, the air egress channel being spaced apart from the air ingress channel by the disks;
an intermediate channel comprising gaps between the disks and in fluid communication with the air ingress channel and the air egress channel;
a fan disposed within the air egress channel and being operable to form a negative pressure in the air egress channel; and
vertical partitions disposed within the housing, the disks being arranged in the rows in the chassis, the disks being further arranged as abutting against the vertical partitions;
wherein the air ingress channel of the heatsink comprises a plurality of air flow outlets arranged as being corresponding to the gaps between the disks;
wherein the air egress channel of the heatsink comprises a plurality of air flow inlets arranged as being corresponding to the gaps between the disks; and
wherein areas of each of the air flow outlets and each of the air flow inlets gradually reduce from the first end towards the second end.

* * * * *